United States Patent
Yamasaki (10) Patent No.: US 9,580,264 B2
(45) Date of Patent: Feb. 28, 2017

(54) CARRIER TAPE FEEDER FOR CHIP MOUNTER

(71) Applicant: Hanwha Techwin Co., Ltd., Changwon-si (KR)

(72) Inventor: Kimiyuki Yamasaki, Changwon (KR)

(73) Assignee: Hanwha Techwin Co., Ltd., Changwon-si (KR)

( * ) Notice: Subject to any disclaimer, the term of this patent is extended or adjusted under 35 U.S.C. 154(b) by 0 days.

(21) Appl. No.: 14/420,021

(22) PCT Filed: Apr. 3, 2013

(86) PCT No.: PCT/KR2013/002744
§ 371 (c)(1),
(2) Date: Feb. 6, 2015

(87) PCT Pub. No.: WO2014/025115
PCT Pub. Date: Feb. 13, 2014

(65) Prior Publication Data
US 2015/0223373 A1     Aug. 6, 2015

(30) Foreign Application Priority Data

Aug. 6, 2012 (KR) .......................... 10-2012-0085997
Sep. 21, 2012 (KR) .......................... 10-2012-0105250

(51) Int. Cl.
*B65H 20/20*     (2006.01)
*H05K 13/04*    (2006.01)
*H05K 13/02*    (2006.01)

(52) U.S. Cl.
CPC .............. *B65H 20/20* (2013.01); *H05K 13/02* (2013.01); *H05K 13/0417* (2013.01)

(58) Field of Classification Search
CPC ................................ B65H 20/20; H05K 13/02
See application file for complete search history.

(56) References Cited

U.S. PATENT DOCUMENTS 5,299,902 A    4/1994  Fujiwara et al.
8,678,065 B2   3/2014  Hwang et al.
(Continued)

FOREIGN PATENT DOCUMENTS

CN    101835370 A    9/2010
CN    102209462 A    10/2011
(Continued)

OTHER PUBLICATIONS

Int. Search Report dated Jul. 23, 2013 issued in Int. Application No. PCT/KR2013/002744 (PCT/ISA/210).
(Continued)

*Primary Examiner* — Michael McCullough
(74) *Attorney, Agent, or Firm* — Sughrue Mion, PLLC (57) ABSTRACT

Disclosed is a carrier tape feeder for a chip mounter. The carrier tape feeder includes: a body part; a rotation part, which is rotatably mounted on the body part and rotates by being engaged with a portion of a first carrier tape; a handle part, which is disposed by being separated by a predetermined distance from the outer circumferential surface of the rotation part, is rotatably mounted on the body part, and is selectively engaged with a second carrier tape; and a block part, which is rotatably mounted on the body part and exerts a force to the second carrier tape towards the rotation part according to rotation of the handle part.

21 Claims, 5 Drawing Sheets

(56) References Cited

U.S. PATENT DOCUMENTS

2010/0239401 A1 9/2010 Kim
2011/0243695 A1* 10/2011 Hwang .............. H05K 13/0084
　　　　　　　　　　　　　　　　　　　414/412

FOREIGN PATENT DOCUMENTS

| JP | 2008-277509 A | 11/2008 | | |
|----|---|---|---|---|
| JP | 2009-245997 A | 10/2009 | | |
| JP | 2011211169 A | 10/2011 | | |
| JP | WO 2012049799 A1 * | 4/2012 | ......... | H05K 13/0084 |
| KR | 10-1125287 B1 | 3/2012 | | |

OTHER PUBLICATIONS

Written Opinion dated Jul. 23, 2013 issued in Int. Application No. PCT/KR2013/002744 (PCT/ISA/237).
Communication dated Aug. 25, 2016, issued by the State Intellectual Property Office of P.R. China in counterpart Chinese Application No. 201380041874.5.

* cited by examiner

CARRIER TAPE FEEDER FOR CHIP MOUNTER

TECHNICAL FIELD

The present invention relates to a carrier tape feeder, and more particularly, to a carrier tape feeder for a chip mounter.

BACKGROUND ART

In general, to mount semiconductors, semiconductor parts may be provided by mounting a carrier tape feeder for a chip mounter in the chip mounter. In this case, the carrier tape feeder for a chip mounter may provide semiconductor parts to the chip mounter by installing a carrier tape including the semiconductor parts therein.

The carrier tape feeder for a chip mounter may operate by mounting a winding roll around which a carrier tape is wound outside the carrier tape feeder and supplying the carrier tape to the carrier tape feeder for a chip mounter. In detail, the carrier tape may be supplied to the chip mounter via a transfer part inside the carrier tape feeder for a chip mounter.

As described above, the carrier tape supplied to the carrier tape feeder may be continuously supplied to the chip mounter. When the carrier tape wound around the winding roll is completely supplied, the winding roll may be replaced by a new winding roll to supply a carrier tape again.

DISCLOSURE OF INVENTION

Technical Problem

In general, in a case as described above, to replace a winding roll of which a carrier tape has been vanished with a new winding roll, a user should directly replace them with each other. In addition, after replacing the new winding roll, the user should insert a carrier tape into a carrier tape feeder for a chip mounter and start the carrier tape feeder for a chip mounter.

Such a carrier tape feeder for a chip mounter is disclosed in detail in Korea Patent Publication No. 10-2012-0074993 (Title of Invention: Tape feeder and electronic part mounting method using same, Applicant: Mirae corporation).

Solution to Problem

Embodiments of the present invention provide a carrier tape feeder for a chip mounter, which is capable of supplying a plurality of carrier tapes without replacing.

According to an aspect of the present invention, there is provided a carrier tape feeder for a chip mounter, including: a body part; a rotation part, which is rotatably mounted on the body part and rotates by being engaged with a portion of a first carrier tape; a handle part, which is disposed by being separated by a predetermined distance from the outer circumferential surface of the rotation part, is rotatably mounted on the body part, and is selectively engaged with a second carrier tape; and a block part, which is rotatably mounted on the body part and exerts a force to the second carrier tape towards the rotation part according to rotation of the handle part.

Advantageous Effects of Invention

According to the embodiments of the present invention, a plurality of carrier tapes can be supplied to a chip mounter without replacing, thereby performing a smooth mounting work.

In addition, a plurality of carrier tapes can be automatically supplied through a simple structure instead of manually replacing them by a skilled worker, thereby minimizing flaws and malfunctions in products due to a non-skilled worker.

BEST MODE FOR CARRYING OUT THE INVENTION

According to an aspect of the present invention, there is provided a carrier tape feeder for a chip mounter, including: a body part; a rotation part, which is rotatably mounted on the body part and rotates by being engaged with a portion of a first carrier tape; a handle part, which is disposed by being separated by a predetermined distance from the outer circumferential surface of the rotation part, is rotatably mounted on the body part, and is selectively engaged with a second carrier tape; and a block part, which is rotatably mounted on the body part and exerts a force to the second carrier tape towards the rotation part according to rotation of the handle part.

A first insertion hole may be formed on a portion of the first carrier tape, and the rotation part may include a gear tooth formed on the outer surface thereof in a protrusion shape and inserted into the first insertion hole.

A second insertion hole may be formed on a portion of the second carrier tape, and the handle part may include an insertion protrusion of which a portion protrudes to be selectively inserted into the second insertion hole.

The handle part may include a holding part formed for a user to hold.

The handle part may include a movement prevention part, which is formed to protrude towards the rotation part and prevents the second carrier tape from moving.

The carrier tape feeder may further include a position limitation part formed on any one of the handle part and the block part to limit rotation of the block part.

The carrier tape feeder may further include a guide part formed on the other one of the handle part and the block part to guide the position limitation part.

The position limitation part may include a position limitation protrusion formed to protrude from the outer surface of any one of the handle part and the block part, and the guide part may include a guide hole formed on the outer surface of the other one of the handle part and the block part so that the position limitation protrusion is inserted thereinto.

The guide hole may be formed in an elongated hole shape.

The handle part and the block part may have the same center of rotation.

The block part may be formed of which a surface contacting the second carrier tape is sloped towards a transfer direction of the first carrier tape.

The carrier tape feeder may further include a first elastic part mounted between the handle part and the block part to exert a force to the handle part and the block part in a direction in which a portion of the handle part is gradually apart from the block part.

The carrier tape feeder may further include an expulsion prevention member mounted between the handle part and the block part to prevent the first elastic part from being expelled.

The carrier tape feeder may further include a connection member for connecting the handle part and the body part to thereby limit a rotation angle of the handle part.

The carrier tape feeder may further include a second elastic part disposed between the handle part and the body part to exert a force to the handle part in a direction that is opposite to a rotation direction of the handle part when the handle part rotates.

According to another aspect of the present invention, there is provided a carrier tape feeder including: a body part in which a single loading port through which a plurality of carrier tapes are loaded and a part absorption part for absorbing parts embedded in the carrier tapes are formed; a transfer part for transferring a first carrier tape to the part absorption part; and a carrier tape loading part connected to the transfer part to transfer to the transfer part a second carrier tape subsequently loaded when the first carrier tape is completely transferred to the transfer part, wherein the carrier tape loading part restricts the second carrier tape from being transferred to the part absorption part while the first carrier tape is being engaged with the transfer part and connects a second insertion hole of the second carrier tape to the transfer part when the first carrier tape is released from the transfer part.

An end of the carrier tape loading part may be inserted into the second insertion hole formed with a predetermined interval on a side part of the second carrier tape to restrict the transfer of the second carrier tape.

The end of the carrier tape loading part may be withdrawn from the second insertion hole of the second carrier tape to engage the second carrier tape with the transfer part.

The carrier tape loading part may be pivotally connected to the body part.

The carrier tape loading part may be inserted into the second insertion hole of the second carrier tape by pivoting in a direction being far from and then close to the body part when the second carrier tape is loaded to the single loading port.

The carrier tape loading part may include: a handle part on which an insertion protrusion to be inserted into the second insertion hole of the second carrier tape is formed; and a block part for engaging the second carrier tape with the transfer part.

A protruding height of the insertion protrusion may be formed to restrict transfer of at least two second carrier tape while the first carrier tape is being engaged with the transfer part.

The carrier tape loading part may operate by being linked to the transfer part in a way of transferring the second carrier tape to the part absorption part by rotational driving of the transfer part after the second carrier tape is supplied to the transfer part.

The carrier tape loading part may include: a handle part on which an insertion protrusion to be inserted into the second insertion hole of the second carrier tape is formed; and a block part for engaging the second carrier tape with the transfer part, and the carrier tape loading part may operate by being linked to the transfer part in a way of engaging the second carrier tape with the transfer part by the block part after the first carrier tape is released from the transfer part and transferring the second carrier tape to the part absorption part by rotational driving of the transfer part after the second carrier tape is engaged with the transfer part.

Mode for the Invention

The present invention will be clear with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art, and the present invention is only defined by the scope of claims. The terminology used herein is used only to describe specific embodiments and does not have any intention to limit the present invention. An expression in the singular includes an expression in the plural unless the context clearly dictates otherwise. The terms "comprises" and/or "comprising," when used in this specification, specify the presence of stated components, steps, operations, and/or elements, but do not preclude the presence or addition of one or more other components, steps, operations, and/or elements. Though terms like 'first' and 'second' are used to describe various elements, the elements are not limited to these terms. These terms are used only to differentiate an element from another element.

Figure 1:
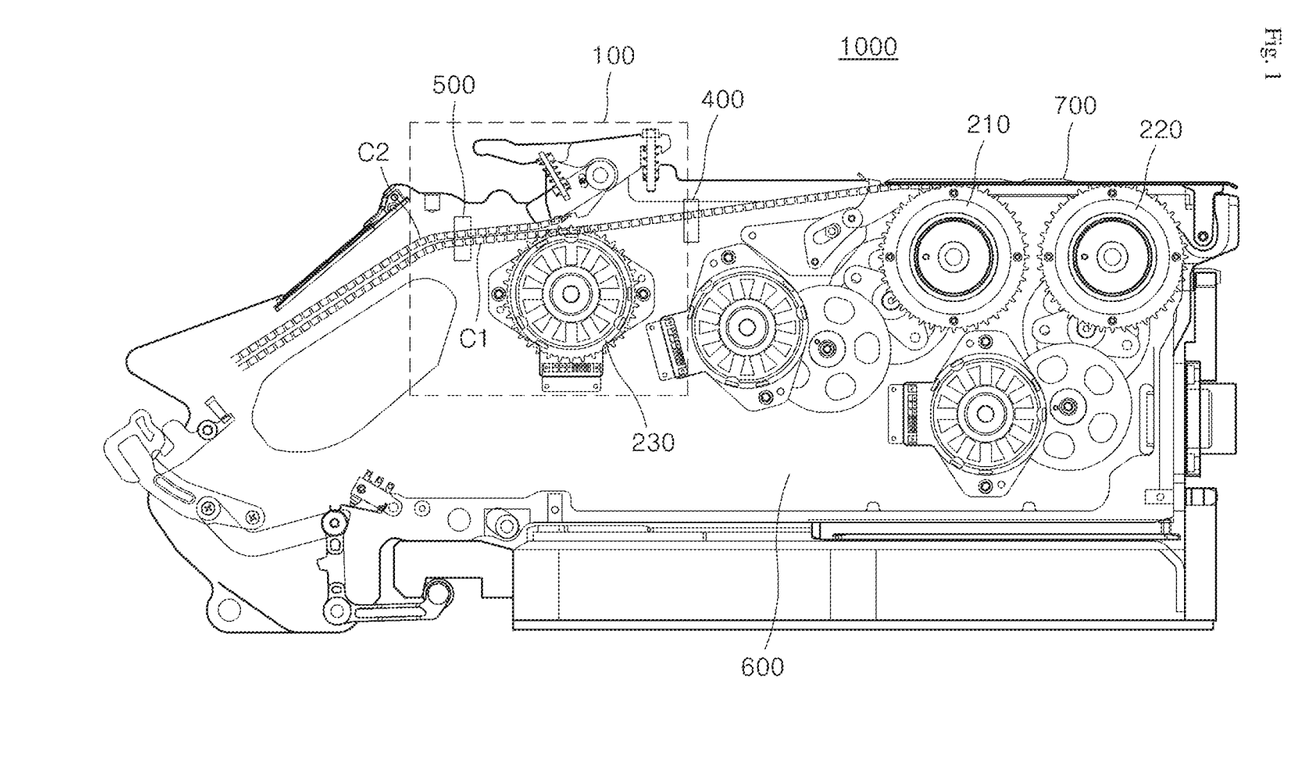
FIG. 1 is a cross-sectional view of a carrier tape feeder for a chip mounter, which includes a carrier tape loading part, according to an embodiment of the present invention.

FIG. 1 is a cross-sectional view of a carrier tape feeder 1000 for a chip mounter, which includes a carrier tape loading part 100, according to an embodiment of the present invention.

Referring to FIG. 1, the carrier tape feeder 1000 for a chip mounter may include a body part 600 in which a single loading part (no reference numeral) through which a plurality of carrier tapes are loaded and a part absorption part 700 for absorbing parts embedded in the carrier tapes are formed. The body part 600 forms an external appearance and may mount therein components for supplying and transferring the carrier tapes.

The plurality of carrier tapes may indicate two or more carrier tapes. Hereinafter, a case where the plurality of carrier tapes indicates two carrier tapes will be mainly described for convenience of description. In particular, a case where the plurality of carrier tapes includes a first carrier tape C1 and a second carrier tape C2 will be mainly described.

The carrier tape feeder 1000 for a chip mounter may include a transfer part (no reference numeral) for transferring the first carrier tape C1 of the plurality of carrier tapes to the part absorption part 700.

The transfer part may include first and second transfer part 210 and 220 for transferring the first carrier tape C1 to the part absorption part 700. In particular, the first and second transfer part 210 and 220 may rotate to transfer the first carrier tape C1 in one direction.

The transfer part may also include a rotation part 230 for transferring the second carrier tape C2 to the first and second transfer part 210 and 220 when the first carrier tape C1 is completely transferred.

The carrier tape feeder 1000 for a chip mounter may include a carrier tape loading part 100. The carrier tape loading part 100 may smoothly supply the plurality of carrier tapes to the transfer part. In particular, the carrier tape loading part 100 may smoothly supply the second carrier tape C2 to the rotation part 230.

The carrier tape loading part 100 may be pivotally connected to the body part 600. In particular, the carrier tape loading part 100 may be inserted into a second insertion hole (not shown) of the second carrier tape C2 by pivoting in a direction being far from and then close to the body part 600 when the second carrier tape C2 is loaded through the single loading port.

The carrier tape feeder 1000 for a chip mounter may include a detecting sensor unit (no reference numeral) for detecting positions or the presence/absence of the plurality of carrier tapes. The detecting sensor unit may be prepared in a plural number, and the plurality of detecting sensor units may include a first detecting sensor unit 400 disposed between the first transfer part 210 and the rotation part 230 to be described below. The plurality of detecting sensor units may also include a second detecting sensor unit 500 disposed to be separated by a predetermined distance from the first detecting sensor unit 400 and disposed at one side of the rotation part 230.

The first detecting sensor unit 400 may check whether the plurality of carrier tapes are replaced. The second detecting sensor unit 500 may check the presence of a new carrier tape by which an existing carrier tape is replaced.

The first detecting sensor unit 400 and the second detecting sensor unit 500 may include all types of sensors capable of detecting an object, such as a photo sensor, a magnetic sensor, an approximate sensor, and the like. However, hereinafter, a case where the first detecting sensor unit 400 and the second detecting sensor unit 500 include a photo sensor will be mainly described in detail for convenience of description.

In detail, the first detecting sensor unit 400 may detect a position of an end of the first carrier tape C1 or the presence/absence of the first carrier tape C1 when the end of the first carrier tape C1 moves through the rotation part 230 while the first carrier tape C1 is being transferred.

In particular, the first detecting sensor unit 400 may emit light towards the first carrier tape C1 while the first carrier tape C1 is moving and may detect the end of the first carrier tape C1 based on whether the light is detected.

The second detecting sensor unit 500 may check the presence/absence of the second carrier tape C2 by operating in a similar way to the operation of the first detecting sensor unit 400.

When an operation of the transfer part and the carrier tape loading part 100 is schematically described, the transfer part may be formed to transfer the first carrier tape C1 to the part absorption part 700.

The carrier tape loading part 100 may be functionally connected to the transfer part and may engage with the transfer part the second carrier tape C2 subsequently loaded when the first carrier tape C1 is released from the transfer part.

In particular, the carrier tape loading part 100 may restrict the second carrier tape C2 from being transferred to the part absorption part 700 while the first carrier tape C1 is being engaged with the transfer part.

In detail, the carrier tape loading part 100 may restrict the second carrier tape C2 from being transferred to the part absorption part 700 by inserting an end of the carrier tape loading part 100 into a second insertion hole formed with a predetermined interval on a side part of the second carrier tape C2.

The carrier tape loading part 100 may engage the second insertion hole of the second carrier tape C2 with the transfer part when the first carrier tape C1 is released from the transfer part. In detail, the second insertion hole of the second carrier tape C2 may be engaged with the transfer part by withdrawing the end of the carrier tape loading part 100 from the second insertion hole.

The carrier tape loading part 100 will now be described in detail.

Figure 2:
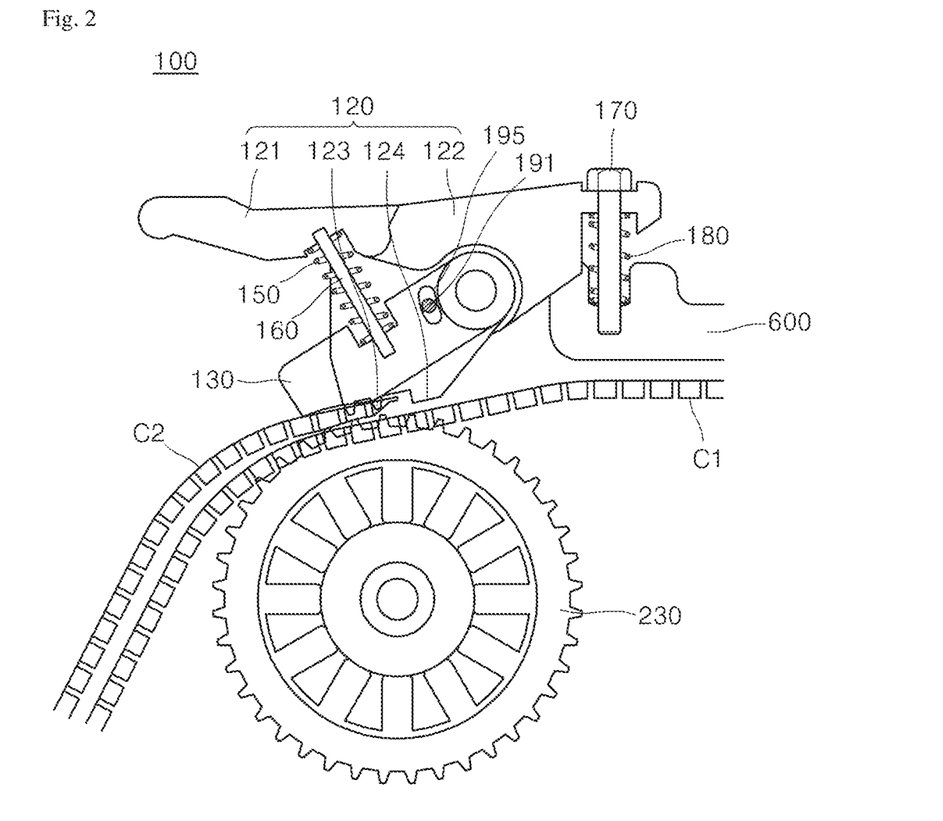
FIG. 2 is a conceptual diagram of the carrier tape loading part of FIG. 1.

FIG. 2 is a conceptual diagram of the carrier tape loading part 100 of FIG. 1. Hereinafter, like reference numbers are used to refer to like elements.

Referring to FIG. 2, the rotation part 230 may be engaged with a portion of the first carrier tape C1. In particular, the rotation part 230 may rotate by being engaged with a portion of the first carrier tape C1 when the first and second transfer part 210 and 220 operate.

The rotation part 230 may include a gear tooth (no reference numeral) formed on the outer surface thereof to protrude. The gear tooth may be formed in a plural number along the outer surface of the rotation part 230. In particular, the gear tooth may be inserted into a first insertion hole (not shown) formed on the first carrier tape C1. In detail, the gear tooth may be inserted into or withdrawn from the first insertion hole while rotating when the first carrier tape C1 moves.

The rotation part 230 may rotate when the first carrier tape C1 moves as described above or may rotate by a separate third driving unit (not shown). The third driving unit may include an actuator, such as a motor, capable of generating a driving force. In particular, the third driving unit may selectively rotate the rotation part 230 by being coupled to the center of rotation of the rotation part 230.

In detail, as described above, when the first and second transfer part 210 and 220 operate, the rotation part 230 may passively rotate. However, the rotation part 230 may actively rotate according to a result measured by the first detecting sensor unit 400.

For example, as described above, when the first detecting sensor unit 400 determines that the first carrier tape C1 has been vanished, the rotation part 230 may rotate to transfer the second carrier tape C2 to the first and second transfer part 210 and 220. In this case, the third driving unit may generate a driving force, and the rotation part 230 may be rotated by the driving force.

The carrier tape loading part 100 may include a handle part 120, which is disposed by being separated by a predetermined distance from the outer circumferential surface of the rotation part 230 and is rotatably mounted on the body part 600. The handle part 120 may selectively engage the second carrier tape C2 contacting the outer surface of the first carrier tape C1.

In detail, the handle part 120 may include a holding part 121 formed for a user to be able to hold. The handle part 120 may also include a handle body part 122 formed to extend from the holding part 121 and rotatably mounted on the body part 600. The holding part 121 may be formed of a synthetic resin material capable of increasing the convenience of the user. In particular, the holding part 121 may be mounted to surround the outer surface of a portion of the handle body part 122.

The handle part 120 may include an insertion protrusion 123 formed to protrude from the handle body part 122. The insertion protrusion 123 may be formed to protrude from the handle body part 122 towards the rotation part 230. In addition, the insertion protrusion 123 may be prepared in a plural number, and the plurality of insertion protrusions 123 may be formed to be apart by a predetermined distance from each other.

In particular, the plurality of insertion protrusions 123 may be formed to be inserted into second insertion holes formed on the second carrier tape C2. The plurality of insertion protrusions 123 may be formed so that an interval between every two insertion protrusions 123 corresponds to an interval between every two second insertion holes. Thus, the insertion protrusion 123 may restrict the transfer of the second carrier tape C2 by being selectively inserted into the second insertion hole.

A protruding height of the insertion protrusion 123 may be formed to restrict at least two stacked second carrier tapes C2 while the first carrier tape C1 is being engaged with the transfer part.

That is, the protruding height of the insertion protrusion 123 may be formed to be fully inserted into the second insertion hole of the second carrier tape C2, and when two or more carrier tapes, such as the second carrier tape C2, are stacked, the protruding height of the insertion protrusion 123 may be formed to fully pass through the stacked carrier tapes.

The handle part 120 may include a movement prevention part 124 formed to protrude from the handle body part 122 towards the rotation part 230. That is, the movement prevention part 124 may be formed to be multiply stepped from one surface of the handle body part 122. In this case, the movement prevention part 124 may be formed to be apart by a predetermined distance from the rotation part 230.

The movement prevention part 124 may be formed at a front side than one end of the second carrier tape C2 based on a transfer direction of the first carrier tape C1. Thus, when the first carrier tape C1 is transferred, the movement prevention part 124 may support the one end of the second carrier tape C2 restrict to prevent the second carrier tape C2 from being transferred.

The carrier tape loading part 100 may include a block part 130 rotatably mounted on the body part 600. The center of rotation of the block part 130 may match the center of rotation of the rotation part 230. The block part 130 may exert a force to the second carrier tape C2 towards the rotation part 230 according to rotation of the handle part 120.

In detail, the block part 130 may be formed so that one end thereof is sloped. In this case, a sloped portion of the block part 130 may be formed to contact the upper surface of the second carrier tape C2. In particular, since a length direction from the center of rotation of the block part 130 forms a predetermined angle with the outer surface of the second carrier tape C2, a portion of the lower surface of the block part 130 may form a slope to surface-contact the upper surface of the second carrier tape C2.

The carrier tape loading part 100 may include a position limitation part 191 formed on any one of the handle part 120 and the block part 130 to limit the movement of the block part 130. The carrier tape loading part 100 may also include a guide part 195 formed on the other one of the handle part 120 and the block part 130 to guide the position limitation part 191.

The position limitation part 191 and the guide part 195 may be variously formed. For example, the position limitation part 191 may include a position limitation protrusion (no reference numeral) formed to protrude from the outer surface of any one of the handle part 120 and the block part 130.

The guide part 195 may include a guide hole (no reference numeral) formed on the other one of the handle part 120 and the block part 130 so that the position limitation protrusion is inserted into the guide hole. The guide hole may be formed in an elongated hole shape. Alternatively, the guide hole may be formed in an oval shape.

The guide part 195 may include a guide groove (not shown) formed on the outer surface of the other one of the handle part 120 and the block part 130 in addition to the guide hole.

The guide part 195 may further include a guide protrusion (not shown) formed to protrude from the other one of the handle part 120 and the block part 130 so that the position limitation protrusion is inserted into the guide protrusion. In this case, the guide protrusion may be prepared in a plural number, and the plurality of guide protrusions may be formed to be apart by a predetermined distance from each other and to face each other.

The position limitation part 191 and the guide part 195 are not limited to the above description and may include all elements and structures which limit the movement of the block part 130. However, hereinafter, for convenience of description, a case where the position limitation part 191 includes the position limitation protrusion while the guide part 195 includes the guide hole will be mainly described. In addition, a case where the position limitation part 191 is formed on the outer surface of the handle part 120 while the guide part 195 is formed on the outer surface of the block part 130 will be mainly described.

The carrier tape loading part 100 may include a first elastic part 150 mounted between the handle part 120 and the block part 130. The first elastic part 150 may exert a force to the handle part 120 and the block part 130 in a direction in which a portion of the handle part 120 is gradually apart from the block part 130.

The first elastic part 150 may be variously formed. For example, the first elastic part 150 may include a bar-shaped rubber elastic body formed of a rubber material. Alternatively, the first elastic part 150 may include a torsion spring mounted at the center of rotation of the handle part 120 and the block part 130. Alternatively, the first elastic part 150 may include a compression spring. Hereinafter, for convenience of description, a case where the first elastic part 150 includes the compression spring will be mainly described in detail.

In this case, a first insertion groove (not shown) may be formed on the handle part 120 and the block part 130 so that both ends of the first elastic part 150 are respectively inserted into the first insertion grooves formed on the handle part 120 and the block part 130. Thus, the first elastic part 150 may accurately exert a force to the handle part 120 and the block part 130.

The carrier tape loading part 100 may include an expulsion prevention member 160 mounted between the handle part 120 and the block part 130 to prevent the first elastic part 150 from being expelled. The expulsion prevention member 160 may be mounted to pass through the first elastic part 150 and to be inserted into any one of the handle part 120 and the block part 130. In particular, the expulsion prevention member 160 may maintain a rotation angle difference between the handle part 120 and the block part 130 within a predetermined range when the handle part 120 or the block part 130 rotates.

The carrier tape loading part 100 may include a connection member 170 for connecting the handle part 120 to the body part 600. The connection member 170 may be mounted to be apart by a predetermined distance from the center of rotation of the handle part 120. In particular, the connection member 170 may limit the rotation of the handle part 120 within a predetermined range by being mounted on one end of the handle part 120 to connect the handle part 120 to the body part 600. Alternatively, the connection member 170 may be formed in a bolt shape and be mounted on the body part 600.

The carrier tape loading part 100 may include a second elastic part 180 mounted to be disposed between the handle part 120 and the body part 600. The second elastic part 180 may exert a force to the handle part 120 in a direction that is opposite to a rotation direction of the handle part 120 when the handle part 120 rotates.

The second elastic part 180 may be variously formed. For example, the second elastic part 180 may include a bar-shaped rubber elastic body formed of a rubber material. Alternatively, the second elastic part 180 may include a torsion spring mounted at the center of rotation of the handle part 120. Alternatively, the second elastic part 180 may include a compression spring. Hereinafter, for convenience of description, a case where the second elastic part 180 includes the compression spring will be mainly described in detail.

The second elastic part 180 may be mounted at a place where the connection member 170 is mounted. In detail, the second elastic part 180 may be mounted between the handle part 120 and the body part 600 so that the connection member 170 is inserted into the second elastic part 180. In this case, a second insertion groove (not shown) may be formed on the handle part 120 and the body part 600 so that portions of both ends of the second elastic part 180 are respectively inserted into coupled to the second insertion grooves.

An operation of the carrier tape loading part 100 will now be described in detail.

Figure 3:
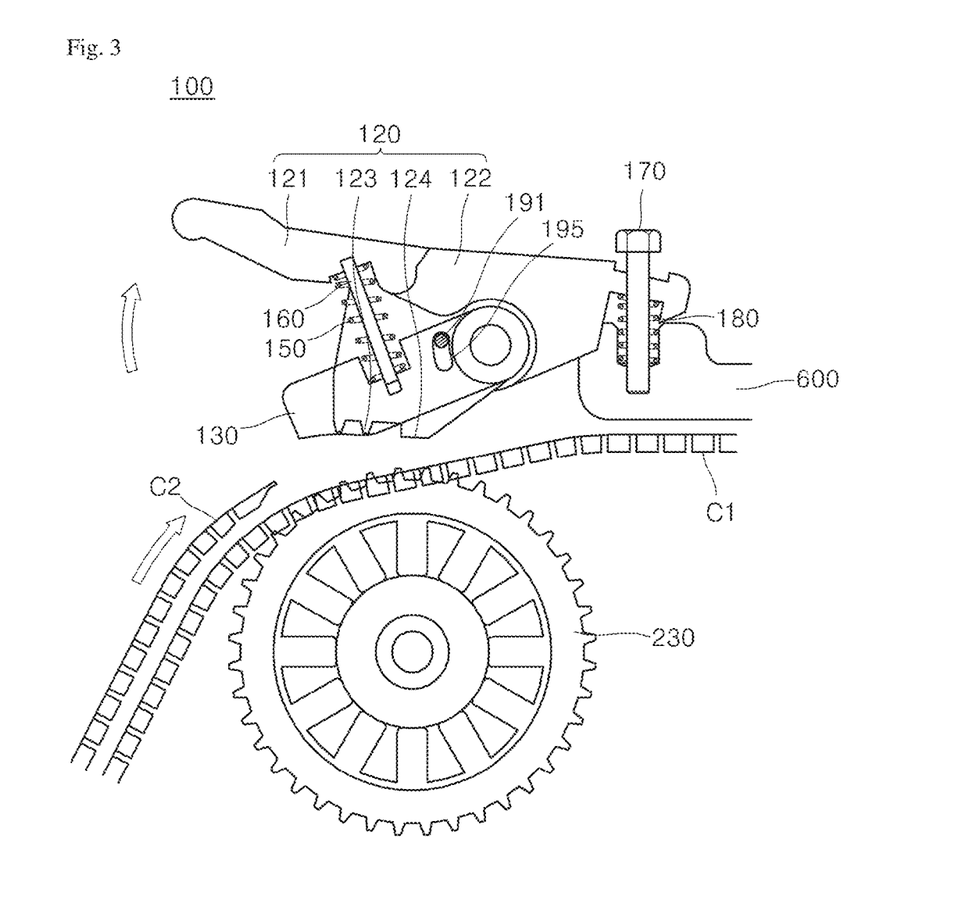
FIG. 3 is an operating diagram illustrating a first operation of the carrier tape loading part of FIG. 2.

FIG. 3 is an operating diagram illustrating a first operation of the carrier tape loading part 100 of FIG. 2. Hereinafter, like reference numbers are used to refer to like elements.

Referring to FIG. 3, to operate the carrier tape feeder 1000 for a chip mounter, a user may mount a first winding roll (not shown) around which the first carrier tape C1 is wound outside the carrier tape feeder 1000 for a chip mounter. In addition, the user may mount a second winding roll (not shown) around which the second carrier tape C2 is wound outside the carrier tape feeder 1000 for a chip mounter.

The first carrier tape C1 may be withdrawn from the first winding roll and be installed in the carrier tape feeder 1000 for a chip mounter. In detail, the first carrier tape C1 may be inserted inside the carrier tape feeder 1000 for a chip mounter through the single loading port formed on the body part 600 and be engaged with the outer surfaces of the first and second transfer parts 210 and 220. The gear tooth of the rotation part 230, the gear tooth of the first transfer part 210, and the gear tooth of the second transfer part 220 may be inserted into some of the first insertion holes formed on the first carrier tape C1.

After the above work is completed, the second carrier tape C2 may be withdrawn from the second winding roll and be inserted into the carrier tape feeder 1000 for a chip mounter. In this case, the second carrier tape C2 may be inserted into the carrier tape feeder 1000 for a chip mounter along the outer surface of the first carrier tape C1. When the second carrier tape C2 is inserted, the second carrier tape C2 may stop at a place where the handle part 120 is located.

When the second carrier tape C2 is inserted as described above, the user may rotate the handle part 120. In detail, when the user holds the holding part 121 and exerts a force to the holding part 121, the handle body part 122 may rotate along with rotation of the holding part 121.

When the handle body part 122 rotates, the handle body part 122 may rotate in a first direction about the body part 600. At this time, the position limitation part 191 may rotate along with the rotation of the handle body part 122.

The position limitation part 191 may move along the inside of the guide hole of the guide part 195 by a predetermined distance while rotating. When the position limitation part 191 arrives at an end of the guide hole, the position limitation part 191 may exert a force to the block part 130. In this case, the block part 130 may rotate in the first direction together with the handle body part 122 by the position limitation part 191.

When the handle body part 122 and the block part 130 move as described above, the second elastic part 180 may exert a force to the handle body part 122 in a second direction that is opposite to the first direction. In this case, the second elastic part 180 may be compressed by the movement of the handle body part 122.

When the handle body part 122 is rotated in the first direction through the holding part 121, a space may be formed between the block part 130 and the first carrier tape C1. At this time, one end of the second carrier tape C2 may be disposed at one side of the block part 130 through the space.

Figure 4:
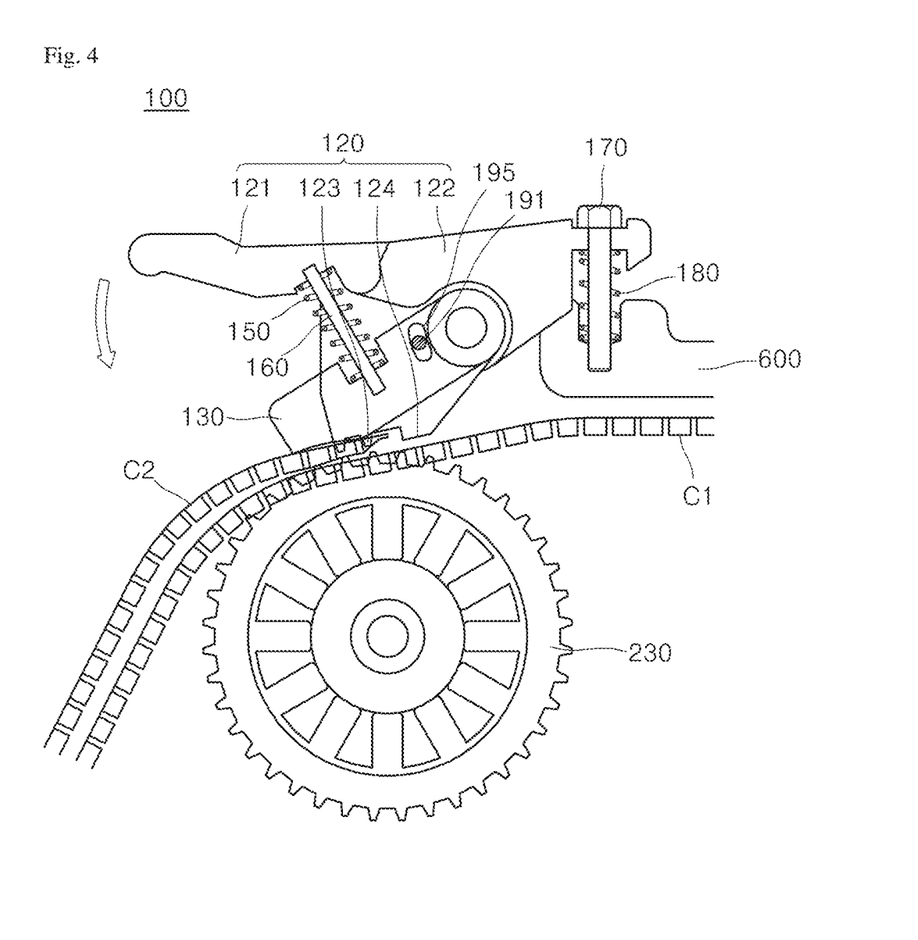
FIG. 4 is an operating diagram illustrating a second operation of the carrier tape loading part of FIG. 2.

FIG. 4 is an operating diagram illustrating a second operation of the carrier tape loading part 100 of FIG. 2. Hereinafter, like reference numbers are used to refer to like elements.

Referring to FIG. 4, after the second carrier tape C2 is completely disposed as described above, the user may rotate the handle part 120 in the second direction. At this time, as described above, the second elastic part 180 may exert a force to the handle body part 122 in the second direction to help the rotation of the handle part 120.

When the handle part 120 rotates in the second direction as described above, the block part 130 may also rotate in the second direction. At this time, the first elastic part 150 may exert a force to separate the block part 130 and the handle body part 122 from each other.

When the handle part 120 and the block part 130 rotate as described above, a rotation angle of the handle part 120 may be limited. In detail, when the handle part 120 rotates in the second direction, the handle body part 122 may contact a portion of the connection member 170.

A cross-sectional area of one end of the connection member 170 may be formed differently from cross-sectional areas of the other portions of the connection member 170. For example, the cross-sectional area of the one end of the connection member 170 may be formed to be larger than the cross-sectional areas of the other portions of the connection member 170.

Thus, since the handle body part 122 cannot rotate any more when the handle body part 122 arrives at the one end of the connection member 170 while rotating in the second direction, a rotation angle of the handle body part 122 may be limited. In particular, by limiting the rotation of the handle body part 122, the connection member 170 may prevent the second carrier tape C2 from being damaged due to an excessive press of the handle part 120 onto the second carrier tape C2.

When the handle body part 122 rotates as described above, the insertion protrusion 123 may be inserted into the second insertion hole formed on the second carrier tape C2. Thus, the second carrier tape C2 may be engaged with the handle part 120 through the insertion protrusion 123.

In addition, when the handle body part 122 rotates as described above, the block part 130 may contact the outer surface of the second carrier tape C2. In particular, the sloped lower surface of the block part 130 may contact the upper surface of the second carrier tape C2.

At this time, the block part 130 may rotate in the first direction by a predetermined angle while contacting the outer surface of the second carrier tape C2. In detail, the block part 130 may rotate in the first direction in proportional to a thickness of the second carrier tape C2.

In particular, when the block part 130 rotates in the first direction as described above, the first elastic part 150 may exert a force to the block part 130 towards the rotation part 230. In this case, the block part 130 has a close contact with the second carrier tape C2 and may exert a force to the second carrier tape C2 towards the rotation part 230 and the first carrier tape C1. In particular, the second carrier tape C2 may move in a transfer direction of the first carrier tape C1 together with the first carrier tape C1 due to an external force, such as a frictional force, while the first carrier tape C1 is being transferred.

In this case, the insertion protrusion 123 may primarily prevent the second carrier tape C2 from being transferred together with the first carrier tape C1 by being engaged with the second carrier tape C2. In addition, when the second carrier tape C2 is released from the insertion protrusion 123, the movement prevention part 124 may prevent the second carrier tape C2 from being transferred.

Thus, while the first carrier tape C1 is continuously being transferred to the external chip mounter (not shown), the second carrier tape C2 may stably maintain a nonmoving state.

When the carrier tape loading part 100 operates as described above, the first carrier tape C1 may be engaged with the transfer part. In detail, the first carrier tape C1 may be sequentially engaged with the rotation part 230, the first transfer part 210, and the second transfer part 220.

In addition, when the first transfer part 210 and the second transfer part 220 operate, the first carrier tape C1 may be transferred in a state where the first carrier tape C1 is engaged with the transfer part. In this case, as described above, an end of the carrier tape loading part 100 may restrict the second carrier tape C2 from being transferred to the part absorption part 700 by being inserted into the second insertion hole of the second carrier tape C2.

While the carrier tape loading part 100 is operating as described above, the first carrier tape C1 wound around the first winding roll may be fully vanished. In particular, when the first carrier tape C1 is fully vanished, the first carrier tape C1 may be released from the transfer part. At this time, the first detecting sensor unit 400 may determine whether the first carrier tape C1 is vanished.

In detail, the first detecting sensor unit 400 may output a signal to the outside when the first carrier tape C1 is fully vanished. For example, the first detecting sensor unit 400 may check the presence of the first carrier tape C1 since light is not detected by the photo sensor when the first carrier tape C1 exists. On the contrary, when the first carrier tape C1 does not exist, the first detecting sensor unit 400 may check the absence of the first carrier tape C1 since light is detected by the photo sensor.

As described above, when first detecting sensor unit 400 determines that the first carrier tape C1 does not exist, the carrier tape loading part 100 may supply the second carrier tape C2 to the transfer part.

When the second carrier tape C2 is supplied as described above, the second carrier tape C2 may be engaged with the transfer part. In particular, the second carrier tape C2 may be engaged with the rotation part 230. In particular, in this case, the insertion protrusion 123 may be released from the second insertion hole of the second carrier tape C2. At this time, the gear tooth of the rotation part 230 may be inserted into the second insertion hole of the second carrier tape C2 to thereby engage the second carrier tape C2 with the rotation part 230.

After the second carrier tape C2 is engaged with the rotation part 230, the rotation part 230 may be rotated. In this case, the carrier tape feeder 1000 for a chip mounter may include a control unit (not shown) for determining a signal and controlling rotation of the rotation part 230 to control the rotation part 230.

As described above, when the first carrier tape C1 is vanished, the second carrier tape C2 may be supplied to the rotation part 230. In detail, when the first carrier tape C1 is fully vanished, the second carrier tape C2 may not contact the first carrier tape C1. At this time, the block part 130 receiving a force towards the rotation part 230 by the first elastic part 150 may exert a force to the second carrier tape C2 towards the rotation part 230.

The second carrier tape C2 may be supplied to the rotation part 230 by the force. At this time, the block part 130 may be limited in its supply path, i.e., its rotation angle, by the position limitation part 191 and the guide part 195.

In detail, when the second carrier tape C2 contacts the first carrier tape C1, the position limitation part 191 may be located at a central portion of the guide part 195. On the contrary, when the second carrier tape C2 does not contact the first carrier tape C1, the position limitation part 191 may not move any more by contacting one end of the guide part 195 by a force exerted by the first elastic part 150.

In particular, when the position limitation protrusion is inserted into the guide hole, the position limitation protrusion may move from the central portion of the guide part 195 to one end of the guide hole and stop there. As described above, an interaction between the position limitation part 191 and the guide part 195 may prevent the block part 130 from exerting an excessive force to the second carrier tape C2.

As described above, when the second carrier tape C2 is engaged with the rotation part 230, the control unit may rotate the rotation part 230. In this case, the first detecting sensor unit 400 may detect a start point of the second carrier tape C2. Since a method of detecting the start point of the second carrier tape C2 is similar as described above, a detailed description thereof is omitted.

The control unit may calculate a time or a distance until the start point of the second carrier tape C2 arrives at the first and second transfer parts 210 and 220 based on the value detected by the first detecting sensor unit 400.

The control unit may control at least one of a rotation speed, a rotation time, and a rotation angle of the rotation part 230 based on the calculated time or distance. When the rotation part 230 rotates, the second carrier tape C2 may be transferred to the first and second transfer parts 210 and 220.

According to the conventional carrier tape supplying method, a worker should wait until the first carrier tape being loaded is almost vanished and connect a start point of the second carrier tape C2 to be subsequently loaded to an end point of the first carrier tape C1 by using an exclusive connection tape or the like.

However, in the carrier tape feeder 1000 for a chip mounter according to an embodiment of the present invention, by loading the second carrier tape C2 to be subsequently loaded at any time and pushing the handle part 120 in the second direction, the second carrier tape C2 may wait and automatically be supplied when the first carrier tape C1 is vanished, and thus, a work amount and a work time required to supply carrier tapes may be reduced.

In addition, according to the conventional carrier tape supplying method, since accuracy is required for a process of connecting the start point of the second carrier tape C2 to the end point of the first carrier tape C1, when a non-skilled worker works, a loss of parts to be mounted may occur in the connection part.

However, in the carrier tape feeder 1000 for a chip mounter according to an embodiment of the present invention, a separate tape connection work is unnecessary, and a plurality of carrier tapes can be simply and automatically supplied, thereby minimizing a product loss due to a work of a non-skilled worker.

Figure 5:
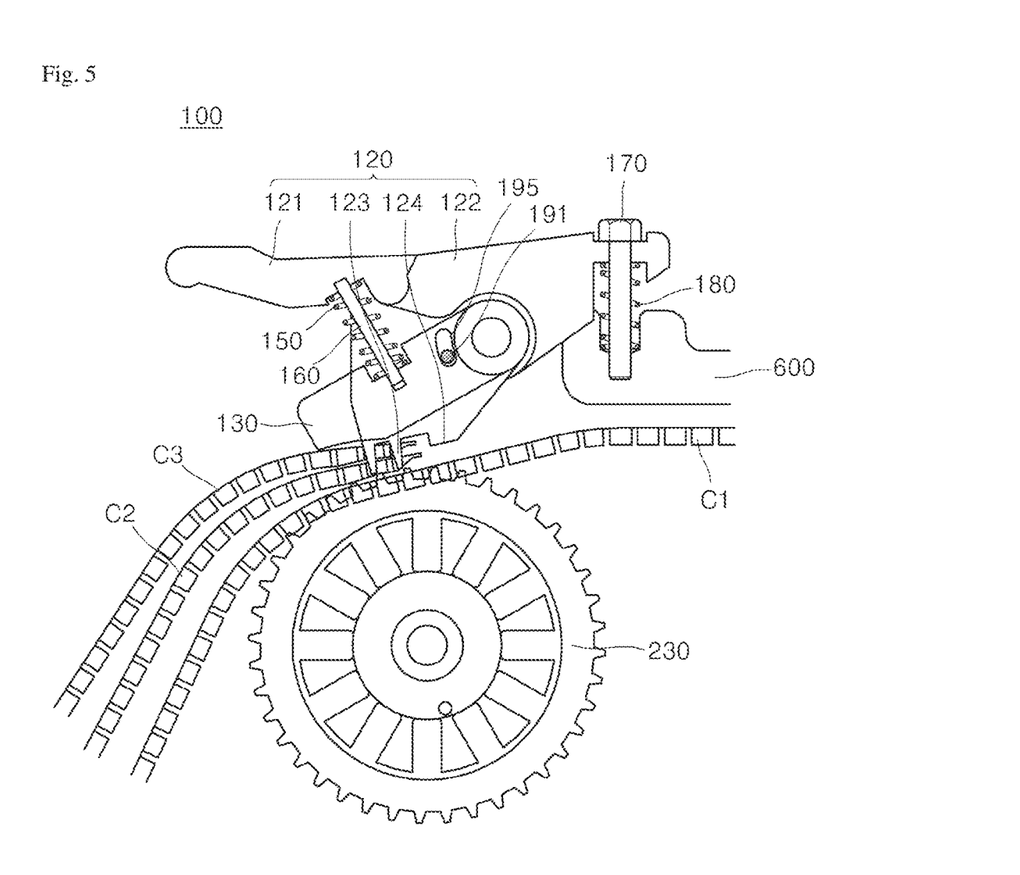
FIG. 5 is an operating diagram illustrating a third operation of the carrier tape loading part of FIG. 2.

FIG. 5 is an operating diagram illustrating a third operation of the carrier tape loading part 100 of FIG. 2. Hereinafter, like reference numbers are used to refer to like elements.

Referring to FIG. 5, the carrier tape loading part 100 may supply a plurality of carrier tapes in a similar way as described above. For example, the carrier tape loading part 100 may supply three or more carrier tapes.

In this case, while the first carrier tape C1 is being transferred, second and third carrier tapes C2 and C3 may wait at the carrier tape loading part 100. The carrier tape loading part 100 may supply the second carrier tape C2 to the rotation part 230 as described above after the first carrier tape C1 is completely transferred. That is, when the first carrier tape C2 is completely supplied to the rotation part 230, the second carrier tape C2 may be transferred to the first and second transfer parts 210 and 220 by the rotation part 230.

When the second carrier tape C2 is completely transferred after the second carrier tape C2 is supplied to the rotation part 230, an operation which is similar to the operation after the first carrier tape C1 is completely transferred may be performed.

In detail, when the second carrier tape C2 is completely transferred, the third carrier tape C3 may be supplied to the rotation part 230 by the block part 130. The rotation part 230 may rotate to transfer the third carrier tape C3 to the first and second transfer parts 210 and 220.

In particular, while the first carrier tape C1, the second carrier tape C2, and the third carrier tape C3 are being sequentially transferred, the block part 130 may make the second and third carrier tapes C2 and C3 wait at the carrier tape loading part 100 and exert a force to the second carrier tape C2 or the third carrier tape C3 to supply the second carrier tape C2 or the third carrier tape C3 to the rotation part 230.

Thus, the carrier tape feeder 1000 for a chip mounter may sequentially supply carrier tapes to the chip mounter without replacing carrier tapes by supplying the first carrier tape C1, the second carrier tape C2, and the third carrier tape C3 to the rotation part 230 by using the block part 130.

In particular, the carrier tape feeder 1000 for a chip mounter may quickly and smoothly perform a part mounting process by sequentially supplying carrier tapes as described above.

While this invention has been particularly shown and described with reference to preferred embodiments thereof, various changes or modifications in form and details may be made therein without departing from the spirit and scope of the invention. Therefore, the appended claims will involve the changes or modifications as long as the changes or modifications belong to the spirit of the invention.

INDUSTRIAL APPLICABILITY

According to an embodiment of the present invention, a carrier tape feeder for a chip mounter is provided, and the carrier tape feeder may be mounted on the chip mounter to supply semiconductor parts. The embodiments of the present invention may be applied to mount semiconductor parts on devices, such as PCBs, electronic devices, and the like, using the semiconductor parts.

The invention claimed is:

1. A carrier tape feeder for a chip mounter, comprising:
   a body part;
   a rotation part, which is rotatably mounted on the body part and rotates by being engaged with a portion of a first carrier tape;
   a handle part, which is disposed by being separated by a predetermined distance from the outer circumferential surface of the rotation part, is rotatably mounted on the body part, and is selectively engaged with a second carrier tape; and
   a block part, which is rotatably mounted on the body part and exerts a force to the second carrier tape towards the rotation part according to rotation of the handle part,
   wherein the handle part is configured to rotate with respect to the block part by a predetermined distance and is configured to move together with the block part beyond the predetermined distance.

2. The carrier tape feeder of claim 1, wherein a first insertion hole is formed on a portion of the first carrier tape, and
   wherein the rotation part comprises a gear tooth formed on the outer surface thereof in a protrusion shape and inserted into the first insertion hole.

3. The carrier tape feeder of claim 1, wherein a second insertion hole is formed on a portion of the second carrier tape, and
   wherein the handle part comprises an insertion protrusion of which a portion protrudes to be selectively inserted into the second insertion hole.

4. The carrier tape feeder of claim 1, wherein the handle part comprises a holding part formed for a user to hold.

5. The carrier tape feeder of claim 1, wherein the handle part comprises a movement prevention part, which is formed to protrude towards the rotation part and prevents the second carrier tape from moving.

6. The carrier tape feeder of claim 1, wherein the handle part and the block part have the same center of rotation.

7. The carrier tape feeder of claim 1, wherein the block part is formed of which a surface contacting the second carrier tape is sloped towards a transfer direction of the first carrier tape.

8. The carrier tape feeder of claim 1, further comprising a first elastic part mounted between the handle part and the block part to exert a force to the handle part and the block part in a direction in which a portion of the handle part is gradually apart from the block part.

9. The carrier tape feeder of claim 8, further comprising an expulsion prevention member mounted between the handle part and the block part to prevent the first elastic part from being expelled.

10. The carrier tape feeder of claim 8, further comprising a second elastic part disposed between the handle part and the body part to exert a force to the handle part in a direction that is opposite to a rotation direction of the handle part when the handle part rotates.

11. The carrier tape feeder of claim 1, further comprising a connection member for connecting the handle part and the body part to thereby limit a rotation angle of the handle part.

12. A carrier tape feeder for a chip mounter, comprising:
a body part;
a rotation part, which is rotatably mounted on the body part and rotates by being engaged with a portion of a first carrier tape;
a handle part, which is disposed by being separated by a predetermined distance from the outer circumferential surface of the rotation part, is rotatably mounted on the body part, and is selectively engaged with a second carrier tape;
a block part, which is rotatably mounted on the body part and exerts a force to the second carrier tape towards the rotation part according to rotation of the handle part;
a position limitation part formed on any one of the handle part and the block part to limit rotation of the block part; and
a guide part formed on the other one of the handle part and the block part to guide the position limitation part,
wherein the position limitation part comprises a position limitation protrusion formed to protrude from the outer surface of any one of the handle part and the block part, and
wherein the guide part comprises a guide hole formed on the outer surface of the other one of the handle part and the block part so that the position limitation protrusion is inserted thereinto.

13. The carrier tape feeder of claim 12, wherein the guide hole is formed in an elongated hole shape.

14. A carrier tape feeder comprising:
a body part in which a single loading port through which a plurality of carrier tapes are loaded and a part absorption part for absorbing parts embedded in the carrier tapes are formed;
a transfer part for transferring a first carrier tape to the part absorption part; and
a carrier tape loading part connected to the transfer part to transfer to the transfer part a second carrier tape subsequently loaded when the first carrier tape is completely transferred to the transfer part, the carrier tape loading part comprising:
a handle part on which an insertion protrusion to be inserted into the second insertion hole of the second carrier tape is formed; and
a block part for engaging the second carrier tape with the transfer part,
wherein the carrier tape loading part restricts the second carrier tape from being transferred to the part absorption part while the first carrier tape is being engaged with the transfer part and connects a second insertion hole of the second carrier tape to the transfer part when the first carrier tape is released from the transfer part, and
wherein the handle part is configured to rotate with respect to the block part by a predetermined distance and is configured to move together with the block part beyond the predetermined distance.

15. The carrier tape feeder of claim 14, wherein an end of the carrier tape loading part is inserted into the second insertion hole formed with a predetermined interval on a side part of the second carrier tape to restrict the transfer of the second carrier tape.

16. The carrier tape feeder of claim 14, wherein an end of the carrier tape loading part is withdrawn from the second insertion hole of the second carrier tape to engage the second carrier tape with the transfer part.

17. The carrier tape feeder of claim 14, wherein the carrier tape loading part is pivotally connected to the body part.

18. The carrier tape feeder of claim 14, wherein the carrier tape loading part is inserted into the second insertion hole of the second carrier tape by pivoting in a direction being far from and then close to the body part when the second carrier tape is loaded to the single loading port.

19. The carrier tape feeder of claim 14, wherein a protruding height of the insertion protrusion is formed to restrict transfer of at least two second carrier tape while the first carrier tape is being engaged with the transfer part.

20. The carrier tape feeder of claim 14, wherein the carrier tape loading part is configured to operate by being linked to the transfer part in a way of transferring the second carrier tape to the part absorption part by rotational driving of the transfer part after the second carrier tape is supplied to the transfer part.

21. The carrier tape feeder of claim 14,
wherein the carrier tape loading part operates by being linked to the transfer part in a way of engaging the second carrier tape with the transfer part by the block part after the first carrier tape is released from the transfer part and transferring the second carrier tape to the part absorption part by rotational driving of the transfer part after the second carrier tape is engaged with the transfer part.

* * * * *